(12) United States Patent
Chang et al.

(10) Patent No.: US 11,683,904 B2
(45) Date of Patent: Jun. 20, 2023

(54) GUIDE HOLDERS FOR ENGAGING A MOTHERBOARD SLED WITH AN INPUT-OUTPUT SLED STACKED THEREON

(71) Applicant: QUANTA COMPUTER INC., Taoyuan (TW)

(72) Inventors: Chun Chang, Taoyuan (TW); Shih-Hsuan Hu, Taoyuan (TW); Cheng-Feng Tsai, Taoyuan (TW); Yu-Hsun Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/407,882

(22) Filed: Aug. 20, 2021

(65) Prior Publication Data

US 2022/0312623 A1    Sep. 29, 2022

Related U.S. Application Data

(60) Provisional application No. 63/167,320, filed on Mar. 29, 2021.

(51) Int. Cl.
*H05K 7/10* (2006.01)
*G06F 1/16* (2006.01)
*H05K 7/14* (2006.01)

(52) U.S. Cl.
CPC ......... *H05K 7/1489* (2013.01); *H05K 7/1487* (2013.01)

(58) Field of Classification Search
CPC .. H05K 7/1402; H05K 7/1409; H05K 7/1411; H05K 7/1415; H05K 7/1417; H05K 7/1487; H05K 7/1489; G06F 1/183; G06F 1/184; G06F 1/185; G06F 1/186; G06F 1/187; G11B 33/124
USPC ....................................... 361/679.02, 679.59
See application file for complete search history.

(56) References Cited

U.S. PATENT DOCUMENTS

| | | | | |
|---|---|---|---|---|
| 5,481,431 | A | * | 1/1996 | Siahpolo ................. G06F 1/187 |
| 5,641,296 | A | * | 6/1997 | Larabell ........... H01R 13/62933 |
| 7,771,218 | B2 | * | 8/2010 | Jaramillo ............. H05K 7/1492 439/157 |
| 9,462,719 | B2 | * | 10/2016 | Wu ....................... H05K 7/1487 |
| 10,251,300 | B1 | * | 4/2019 | Mao ..................... H05K 7/1487 |
| 10,863,644 | B1 | * | 12/2020 | Tseng ................... H05K 7/1487 |
| 11,310,932 | B2 | * | 4/2022 | Chang ..................... H05K 7/16 |
| 2015/0070858 | A1 | * | 3/2015 | Wu ....................... H05K 7/1487 |

(Continued)

*Primary Examiner* — Adrian S Wilson
*Assistant Examiner* — Gage Crum
(74) *Attorney, Agent, or Firm* — Nixon Peabody LLP

(57) ABSTRACT

Guide holders for engaging a motherboard sled with an input-output sled stacked thereon within an electronic chassis, are disclosed. The electronic chassis includes a motherboard sled having a housing having a first sidewall and a second sidewall opposite to the first sidewall, a first guide holder and a second guide holder. The first guide holder is coupled to the first sidewall and includes a first plurality of slots for directing motion of a first plurality of guide pins of an input-output sled in a predetermined direction. The second guide holder is coupled to the second sidewall and includes a second plurality of slots for directing motion of a second plurality of guide pins of the input-output sled in the predetermined direction. The motion of the first plurality of guide pins and the second plurality of guide pins, upon completion, locks the input-output sled to the motherboard sled.

18 Claims, 7 Drawing Sheets

(56) References Cited

U.S. PATENT DOCUMENTS

2015/0103492 A1* 4/2015 Wu ................... H05K 7/1461
361/726
2017/0347481 A1* 11/2017 Kuan ................. H05K 7/1487

* cited by examiner

GUIDE HOLDERS FOR ENGAGING A MOTHERBOARD SLED WITH AN INPUT-OUTPUT SLED STACKED THEREON

CROSS-REFERENCE TO RELATED APPLICATIONS

This application claims priority from and benefit of U.S. Provisional Application No. 63/167,320, entitled "IO Sled Handle Tool-Less Design For Usability And Thermal Optimization To Utilize Different Platform AMD And Intel MB," and filed on Mar. 29, 2021. The contents of that application are hereby incorporated by reference in their entirety.

FIELD OF THE INVENTION

The present invention relates generally to mechanisms for engaging stacked sleds, and more specifically, to guide holders for engaging a motherboard sled with an input-output sled stacked thereon within an electronic chassis.

BACKGROUND OF THE INVENTION

A server is a specialized computer system that includes numerous electrical components integrated into a single unit within an electronic chassis. Common to all servers is a motherboard including a processing unit, such as a Graphics Processing Unit (GPU) or a Central Processing Unit (CPU), memory device slots (e.g., DDR3, DDR4, DRAM), PCIe slots, and connectors to other components, such as hard drives, a power supply, and peripherals (e.g., universal serial bus [USB] ports, local area network [LAN], and other input-output [I/O] ports). The motherboard is placed on a motherboard sled. An input-output (I/O) sled having an input-output (I/O) card is stacked on the motherboard sled prior to assembly into the electronic chassis of the server. The stacked arrangement of motherboard sled containing the motherboard and the I/O sled containing the I/O card is connected with GPU cards in the electronic chassis of a S7W server.

A handle coupled to the I/O sled helps engage the I/O sled with and over the motherboard sled. It is desirable to have a locking mechanism that enables the motherboard sled to adequately lock with the I/O sled in the stacked arrangement, as well as easy assembly and disassembly of the motherboard sled with the I/O sled.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a motherboard sled includes a housing, a first guide holder and a second guide holder. The housing includes a first sidewall and a second sidewall opposite to the first sidewall. The first guide holder is coupled to the first sidewall and includes a first plurality of slots for directing motion of a first plurality of guide pins of an input-output sled in a predetermined direction. The second guide holder is coupled to the second sidewall and includes a second plurality of slots for directing motion of a second plurality of guide pins of the input-output sled in the predetermined direction. The motion of the first plurality of guide pins and the second plurality of guide pins, upon completion, locks the input-output sled to the motherboard sled.

According to certain aspects of the present disclosure, an electronic chassis includes a motherboard sled having a housing, a first guide holder and a second guide holder. The housing includes a first sidewall and a second sidewall opposite to the first sidewall. The first guide holder is coupled to the first sidewall and includes a first plurality of slots for directing motion of a first plurality of guide pins of an input-output sled in a predetermined direction. The second guide holder is coupled to the second sidewall and includes a second plurality of slots for directing motion of a second plurality of guide pins of the input-output sled in the predetermined direction. The motion of the first plurality of guide pins and the second plurality of guide pins, upon completion, locks the input-output sled to the motherboard sled.

According to certain aspects of the present disclosure, the first guide holder is coupled to an inner surface of the first sidewall and the second guide holder is coupled to an inner surface of the second sidewall.

According to certain aspects of the present disclosure, the motherboard sled further comprises a first additional slot on the first guide holder and a second additional slot on the second guide holder. The first additional slot is configured to direct motion of a first additional guide pin of the input-output sled in a direction opposite to the predetermined direction. The second additional slot is configured to direct motion of a second additional guide pin of the input-output sled in a direction opposite to the predetermined direction.

According to certain aspects of the present disclosure, the first plurality of guide pins and the first additional guide pin are disposed along an outer surface of a first side bar along a first edge of a handle rotatably coupled to the input-output sled, and the second plurality of guide pins and the second additional guide pin are disposed along an outer surface of a second side bar along a second edge of the handle.

According to certain aspects of the present disclosure, at least one of the first plurality of slots and at least one of the second plurality of slots includes (i) a first channel having an exterior end and an interior end, and (ii) a second channel extending contiguously from the interior end of the first channel.

According to certain aspects of the present disclosure, the second channel is generally perpendicular relative to the first channel.

According to certain aspects of the present disclosure, the first channel is generally vertical and the second channel is generally horizontal.

According to certain aspects of the present disclosure, the first channel is configured to direct a vertical displacement of the handle of the input-output sled for locking the input-output sled to the motherboard sled.

According to certain aspects of the present disclosure, the second channel is configured to direct a horizontal displacement of the handle of the input-output sled for locking the input-output sled to the motherboard sled.

According to certain aspects of the present disclosure, the exterior ends of the first channel of the first plurality of slots and the second plurality of slots are adjacent to a top edge of the first sidewall and the second sidewall respectively, and the second channel terminates in a closed end.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

Figure 1:
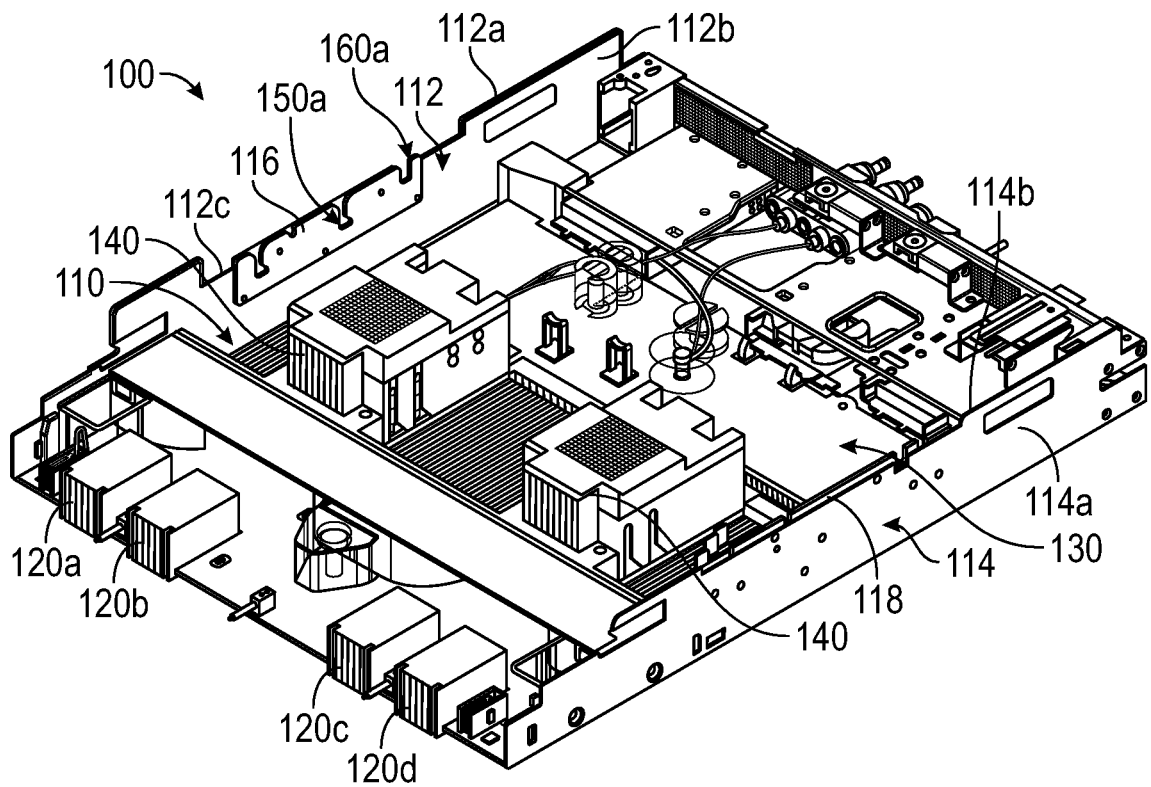
FIG. 1 shows a rear perspective view of a motherboard sled having a first guide holder and a second guide holder, according to certain aspects of the present disclosure.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

Embodiments of the disclosure are directed to guide holders for engaging a motherboard sled with an input-output sled (I/O sled) stacked thereon in an electronic chassis. The guide holders are placed on sidewalls of the motherboard sled and enable the I/O sled to lock with the motherboard sled such that a horizontal and vertical displacement of a handle of the I/O sled can be adequately accommodated. This is achieved through a plurality of slots on the guide holders having vertical and horizontal channels, which can direct motion of the guide pins disposed on outer surfaces of sidebars of the handle. The guide holders are designed to enhance operational usability and flexibility, without affecting thermal performance of the electronic chassis.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2:
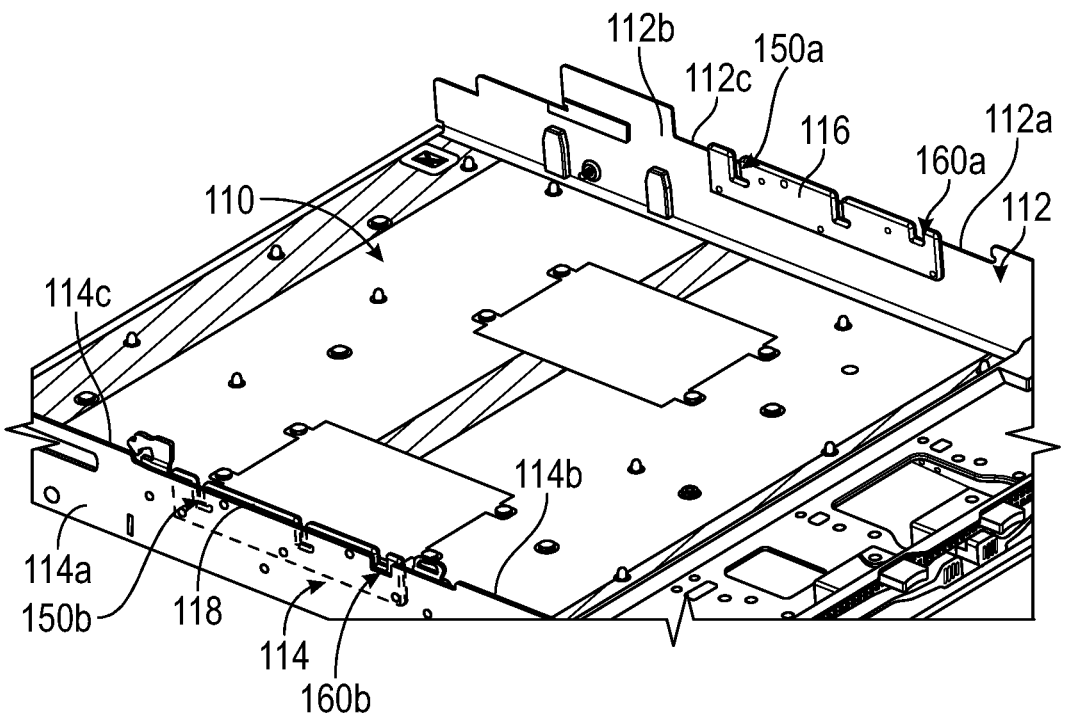
FIG. 2 shows a close-up of the rear perspective view of the motherboard sled of FIG. 1, according to certain aspects of the present disclosure.

Referring to the figures, FIG. 1 shows a rear perspective view of a motherboard sled 100, while FIG. 2 shows a close-up of the rear perspective view of the motherboard sled 100. The motherboard sled 100 is used for carrying a motherboard 130 having one or more heat sinks 140 and four connectors 120a, 120b, 120c, 120d that are configured to mate with one or more GPU cards, upon assembly. The motherboard sled 100 includes a first guide holder 116 and a second guide holder 118 (FIG. 2).

Figure 8:
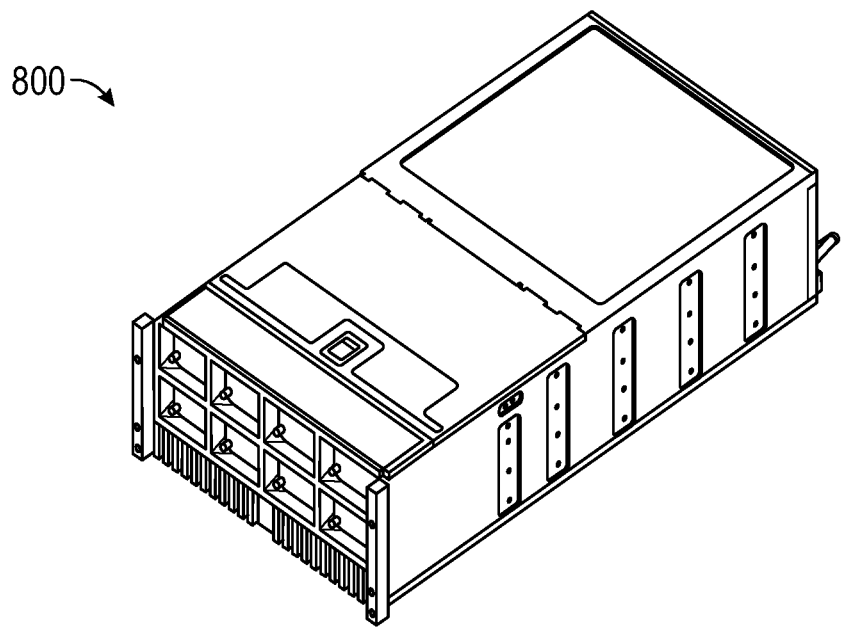
FIG. 8 shows a perspective view of an electronic chassis where the motherboard sled of FIG. 1 is used, according to certain aspects of the present disclosure.

The motherboard sled 100 is configured to be stacked under an I/O sled (e.g., I/O sled 400 of FIGS. 4A-4C) and placed in an electronic chassis of a server (e.g., electronic chassis 800 in FIG. 8). The motherboard sled 100 includes a housing 110 having a first sidewall 112 (on the left side of the rear perspective view of FIG. 1) and a second sidewall 114 opposite to the first sidewall 112 (on the right side of the rear perspective view of FIG. 1). The first sidewall 112 has an outer surface 112a, an inner surface 112b, and a top edge 112c. The second sidewall 114 has an outer surface 114a, an inner surface 114b, and a top edge 114c.

A first guide holder 116 is coupled to the inner surface 112b along the top edge 112c of the first sidewall 112. A second guide holder 118 is coupled to the inner surface 114b along the top edge 114c of the second sidewall 114. The first guide holder 116 and the second guide holder 118 have a generally rectangular-disk shape with slots made therein, as described below. In some embodiments, the first guide holder 116 and the second guide holder 118 are formed from an alloy having zinc.

Figure 3A:
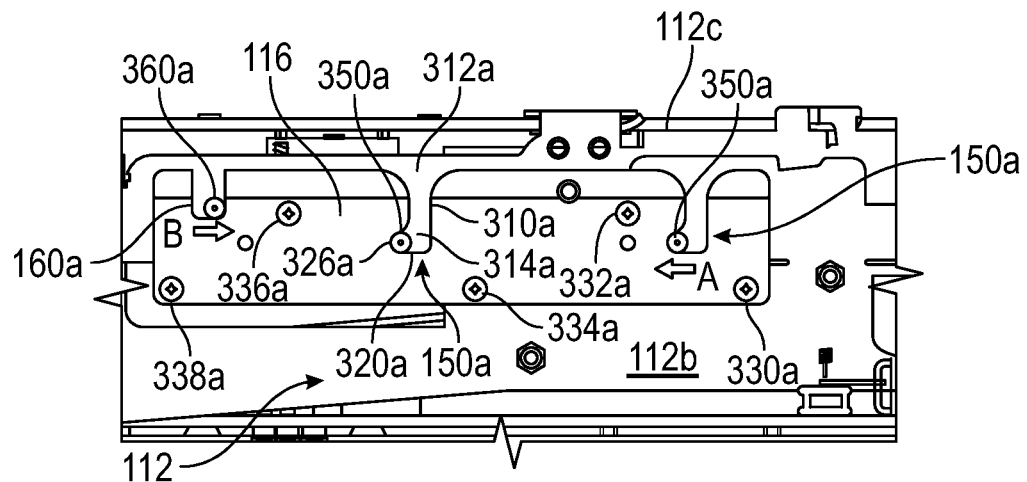
FIGS. 3A-3B show transparent side views of guide holders coupled to opposite sidewalls of the motherboard sled of FIG. 1, according to certain aspects of the present disclosure.
Figure 4A:
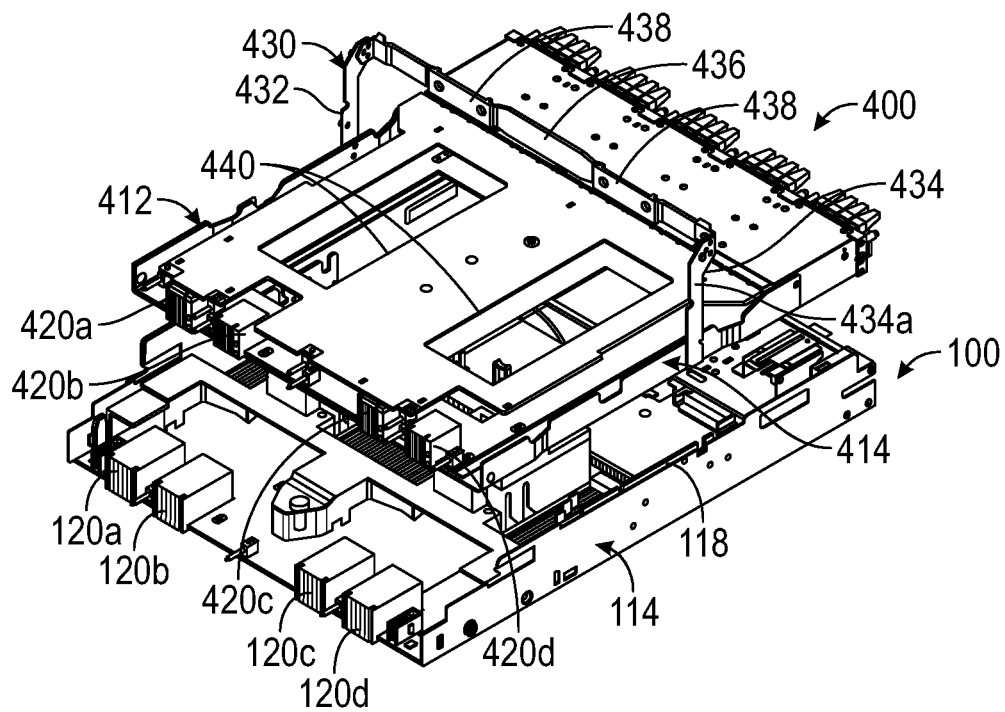
FIG. 4A shows a rear perspective view of the motherboard sled of FIG. 1 and an input-output sled, before being stacked over the motherboard sled, according to certain aspects of the present disclosure.
Figure 4B:
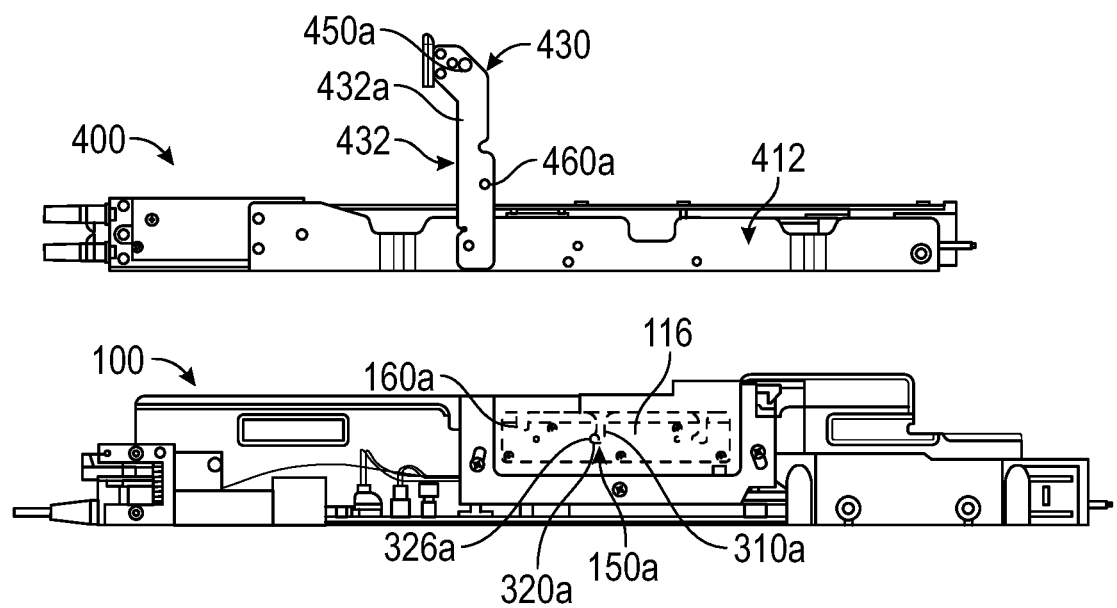
FIGS. 4B-4C show side views, along opposite sidewalls, of the motherboard sled of FIG. 1 and the input-output sled, before being stacked over the motherboard sled, according to certain aspects of the present disclosure.

The first guide holder 116 includes a first plurality of slots 150a for directing motion of a first plurality of guide pins of an I/O sled (e.g., guide pins 450a on outer surface 432a of I/O sled 400 in FIG. 4B) in a predetermined direction (e.g., horizontal arrow A in FIG. 3A). The first guide holder 116 also includes a first additional slot 160a for directing motion of a first additional guide pin of the I/O sled (e.g., guide pin 460a on outer surface 432a of the I/O sled 400 in FIG. 4B) in a direction opposite to the predetermined direction (e.g., horizontal arrow B in FIG. 3A).

Figure 3B:
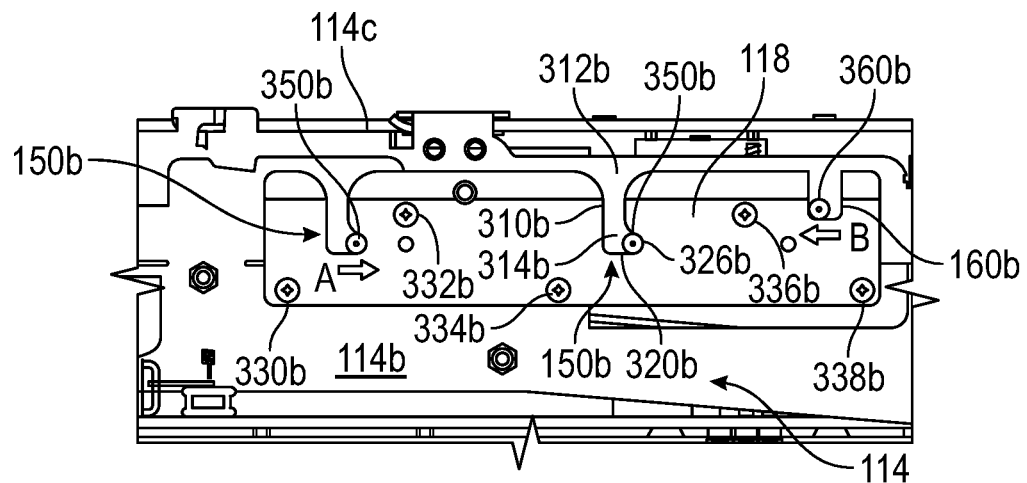
Figure 4C:
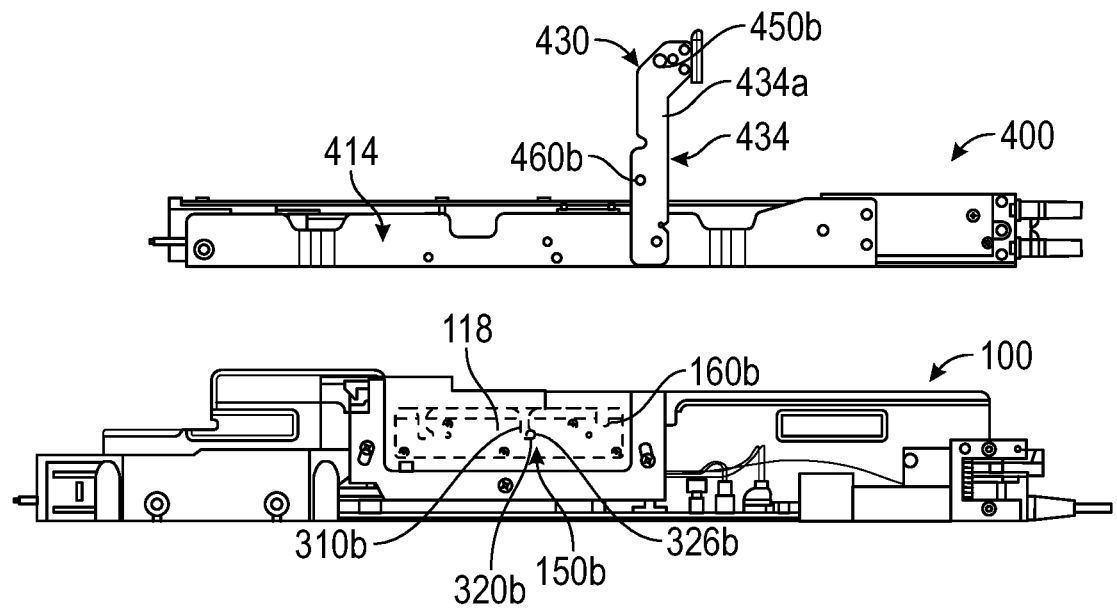

The second guide holder 118 includes a second plurality of slots 150b (FIG. 2) for directing motion of a second plurality of guide pins of the I/O sled (e.g., guide pins 450b on outer surface 434a of I/O sled 400 in FIG. 4C) in the predetermined direction (e.g., horizontal arrow A in FIG. 3B). The second guide holder 118 also includes a second additional slot 160b (FIG. 2) for directing motion of a first additional guide pin of the I/O sled (e.g., guide pin 460b on outer surface 434a of the I/O sled 400 in FIG. 4C) in a direction opposite to the predetermined direction (e.g., horizontal arrow B in FIG. 3B). The motion of the first plurality of guide pins and the second plurality of guide pins, upon completion, locks the I/O sled to the motherboard sled 100, as discussed in further detail below.

FIGS. 3A-3B show transparent side views of the first guide holder 116 coupled to the first sidewall 112 (FIG. 1) and the second guide holder 118 coupled to the second sidewall 114 (FIG. 1) respectively. The first guide holder 116 has similar features as the second guide holder 118. The first guide holder 116 is fastened to the inner surface 112b (FIG. 1) of the first sidewall 112 at five locations using fasteners 330a, 332a, 334a, 336a, and 338a. In different embodiments, the first guide holder 116 may be fastened to the inner surface 112b in any other way and using any number of fasteners.

The first guide holder 116 includes the first plurality of slots 150a for directing motion of a plurality of guide pins 350a in a direction along the horizontal arrow A. The first guide holder 116 also includes the first additional slot 160a for directing motion of an additional guide pin 360a in a direction along the horizontal arrow B, which is opposite to the horizontal arrow A. In some embodiments, the guide pins 350a have a spherical end (not shown) to lock in the first plurality of slots 150a. In the non-limiting embodiment shown in FIG. 3A, the first guide holder 116 includes two slots 150a for directing motion of two guide pins 350a. However, it is contemplated that the first guide holder 116 may include any number of slots for directing motion of an equal number of guide pins.

Each of the first plurality of slots 150a has a first channel 310a and a second channel 320a. The first channel 310a has an exterior end 312a and an interior end 314a. The exterior end 312a is adjacent to the top edge 112c of the first sidewall 112. The second channel 320a is angled relative to the first channel 310a and extends contiguously from the interior end 314a of the first channel 310a. The second channel 320a terminates in a closed end 326a, which marks the location where the motion of the guide pins 350a is completed within each of the first plurality of slots 150a. The second channel 320a is generally perpendicular relative to the first channel 310a. In the non-limiting embodiments shown in FIG. 3A and FIGS. 4A-4B, the first channel 310a is generally vertical and configured to direct a vertical displacement of the guide pins 350a, while the second channel 320a is generally horizontal and configured to direct a horizontal displacement of the guide pins 350a.

As shown in FIG. 3B, the second guide holder 118 is fastened to the inner surface 114b (FIG. 1) of the second sidewall 114 at five locations using fasteners 330b, 332b, 334b, 336b, and 338b. In different embodiments, the second guide holder 118 may be fastened to the inner surface 114b in any other way and using any number of fasteners.

The second guide holder 118 includes the second plurality of slots 150b for directing motion of a plurality of guide pins 350b in a direction along the horizontal arrow A. The second guide holder 118 also includes the second additional slot 160b for directing motion of an additional guide pin 360b in a direction along the horizontal arrow B, which is opposite to the horizontal arrow A. In some embodiments, the guide pins 350b have a spherical end (not shown) to lock in the second plurality of slots 150b. In the non-limiting embodiment shown in FIG. 3B, the second guide holder 118 includes two slots 150b for directing motion of two guide pins 350b. However, it is contemplated that the second guide holder 118 may include any number of slots for directing motion of an equal number of guide pins.

Each of the second plurality of slots 150b has a first channel 310b and a second channel 320b. The first channel 310b has an exterior end 312b and an interior end 314b. The exterior end 312b is adjacent to the top edge 114c of the second sidewall 114. The second channel 320b is angled relative to the first channel 310b and extends contiguously from the interior end 314b of the first channel 310b. The second channel 320b terminates in a closed end 326b, which marks the location where the motion of the guide pins 350b is completed within each of the second plurality of slots 150b. The second channel 320b is generally perpendicular relative to the first channel 310b. In the non-limiting embodiments shown in FIG. 3 and FIGS. 4A and 4C, the first channel 310b is generally vertical and configured to direct a vertical displacement of the guide pins 350b, while the second channel 320b is generally horizontal and configured to direct a horizontal displacement of the guide pins 350b.

FIG. 4A shows a rear perspective view of the motherboard sled 100 and I/O sled 400 before being stacked over the motherboard sled 100. FIGS. 4B-4C show side views, along the first sidewall 112 (FIG. 1) and the second sidewall 114 of the motherboard sled 100 and the I/O sled 400 before being stacked over the motherboard sled 100. The I/O sled 400 includes a first edge 412 and a second edge 414 that are configured to be aligned with the first sidewall 112 and the second sidewall 114 respectively, when the I/O sled 400 is stacked on the motherboard sled 100. The I/O sled 400 includes openings 440 for accommodating the heat sinks 140 (FIG. 1) on the motherboard 130 (FIG. 1) disposed on the motherboard sled 100, when the I/O sled 400 is stacked on the motherboard sled 100. The I/O sled 400 also includes four connectors 420a, 420b, 420c, 420d that are configured to mate with one or more graphics processor unit (GPU) cards, upon assembly.

The I/O sled 400 includes a handle 430 rotatably coupled to the first edge 412 and the second edge 414 of the I/O sled 400. During assembly, the handle 430 is configured to rotate from an unsecured position and lock into a secured position, when the I/O sled 400 is engaged with the motherboard sled 100. The handle 430 includes a first side bar 432 along the first edge 412, a second side bar 434 along the second edge 414, and a cross-bar 436 connecting the first side bar 432 and the second side bar 434. During disassembly, the handle 430 is configured to rotate from the secured position to the unsecured position. The cross-bar 436 includes two pressing pads 438 for holding and rotating the handle 430 between the unsecured position and the secured position.

As shown in FIG. 4B, the first side bar 432 includes an outer surface 432a having a first plurality of guide pins 450a (similar to the guide pins 350a shown in FIG. 3A) and a first additional guide pin 460a (similar to the guide pin 360a shown in FIG. 3A) disposed thereon. The first plurality of guide pins 450a and the first additional guide pin 460a are configured to be placed within the first plurality of slots 150a and the first additional slot 160a respectively on the first guide holder 116. The plurality of slots 150a is configured to direct a vertical displacement and a horizontal displacement of the first plurality of guide pins 450a, while the first additional slot 160a is configured to direct a horizontal displacement of the additional guide pin 460a.

During assembly, each guide pin 450a on the first side bar 432 traverses vertically downwards in the first channel 310a of the respective slot 150a on the first guide holder 116. Each guide pin 450a then traverses horizontally in the second channel 320a towards the closed end 326a of the respective slot 150a on the first guide holder 116. As the guide pins 450a traverse the full length of second channel 320a to arrive at the closed end 326a, the additional guide pin 460a also moves the full length in the additional slot 160a in the opposite direction.

During disassembly, rotation of the handle 430 from the secured position, in the clockwise direction, moves the guide pin 450a in the second channel 320a of the slot 150a away from the closed end 326a towards the first channel 310a. At the same time, the additional guide pin 460a moves in the additional slot 160a in the opposite direction. Then, as the handle 430 is raised into the unsecured position, each of the first plurality of guide pins 450a traverses vertically upwards in the first channel 310a of the respective slot 150a.

Similarly, as shown in FIG. 4C, the second side bar 434 includes an outer surface 434a having a second plurality of guide pins 450b (similar to the guide pins 350b shown in FIG. 3B) and a second additional guide pin 460b (similar to the guide pin 360b shown in FIG. 3B) disposed thereon. The second plurality of guide pins 450b and the second additional guide pin 460b are configured to be placed within the second plurality of slots 150b and the second additional slot 160b respectively on the second guide holder 118. The plurality of slots 150b is configured to direct a vertical displacement and a horizontal displacement of the second plurality of guide pins 450b, while the second additional slot 160b is configured to direct a horizontal displacement of the additional guide pin 460b.

During assembly, each guide pin 450b on the second side bar 434 traverses vertically downwards in the first channel 310b of the respective slot 150b on the second guide holder 118. Each guide pin 450b then traverses horizontally in the second channel 320b towards the closed end 326b of the respective slot 150b on the second guide holder 118. As the guide pins 450b traverse the full length of second channel 320b to arrive at the closed end 326b, the additional guide pin 460b also moves the full length in the additional slot 160b in the opposite direction.

During disassembly, rotation of the handle 430 from the secured position, in the clockwise direction, moves the guide pin 450b in the second channel 320b of the slot 150b away from the closed end 326b towards the first channel 310b. At the same time, the additional guide pin 460b moves in the additional slot 160b in the opposite direction. Then, as the handle 430 is raised into the unsecured position, each of the second plurality of guide pins 450b traverses vertically upwards in the first channel 310b of the respective slot 150b.

Motion of the plurality of guide pins 450a, 450b on the handle 430 of the I/O sled 400 in the plurality of slots 150a, 150b respectively, as well as the reverse motion of the additional guide pins 460a, 460b in the additional slots 160a, 160b respectively, ensures that the I/O sled 400 can be locked with the motherboard sled 100 in the secured position and subsequently unlocked to an unsecured position.

In operation, the I/O sled 400 is first positioned above the motherboard sled 100 such that the first sidewall 112 (FIG. 1) and the second sidewall 114 (FIG. 1) of the motherboard sled 100 are in vertical alignment with the first edge 412 and the second edge 414 of the I/O sled 400, as shown in FIGS. 4A-4C. At this time, the handle 430 of the I/O sled 400 is raised in the unsecured position. Three different stages of assembly of the motherboard sled 100 with the I/O sled 400 using the first guide holder 116 (FIG. 4B) and the second guide holder 118 (FIG. 4C) are shown using FIGS. 5A-5B, FIGS. 6A-6B, and FIGS. 7A-7B.

Figure 5A:
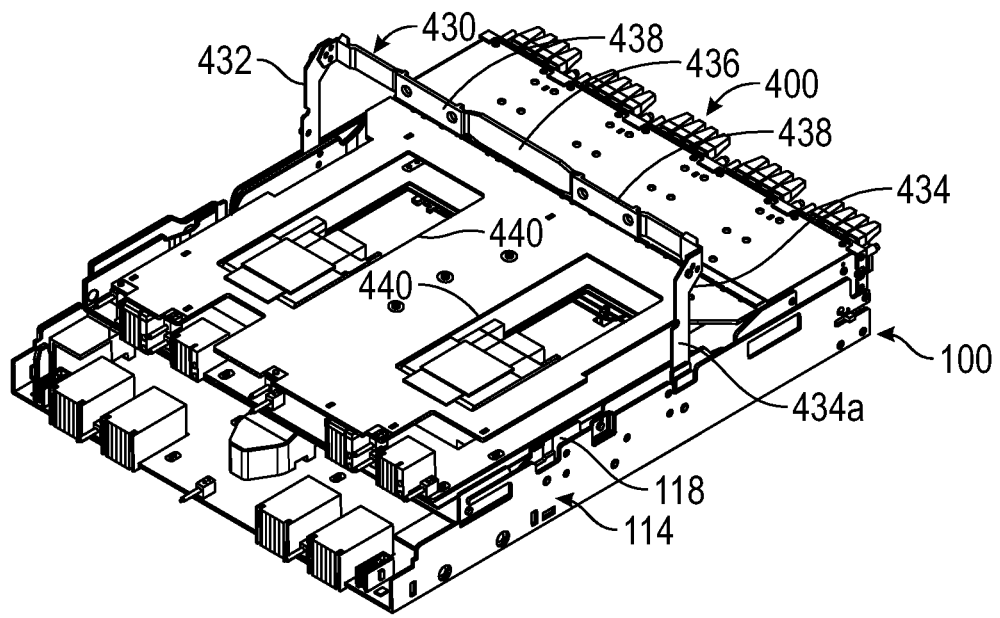
FIG. 5A shows a rear perspective view of the motherboard sled of FIG. 1, before engaging with the input-output sled, according to certain aspects of the present disclosure.
Figure 5B:
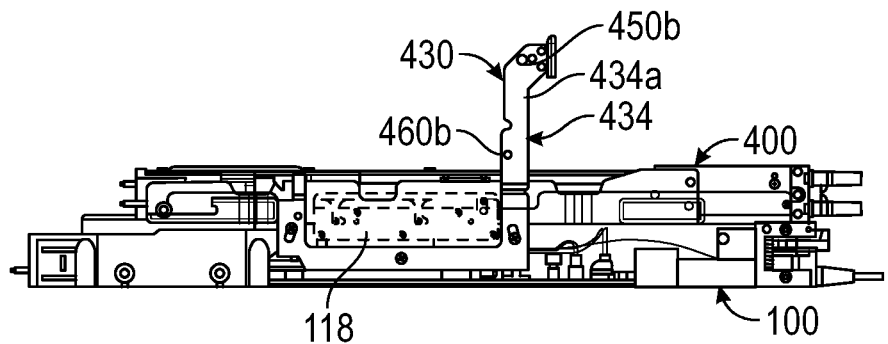
FIG. 5B shows a side view of the motherboard sled of FIG. 1, before engaging with the input-output sled, according to certain aspects of the present disclosure.

FIGS. 5A-5B show a rear perspective view and a side view, respectively, of the motherboard sled 100 before engaging with the I/O sled 400. At this position, the I/O sled 400 is stacked above the motherboard sled 100. The handle 430 sits on the top edges 112c, 114c (FIGS. 1-2) of the motherboard sled 100, and is gently rotated in a counter clockwise direction to engage the motherboard sled 100 with the I/O sled 400.

Figure 6A:
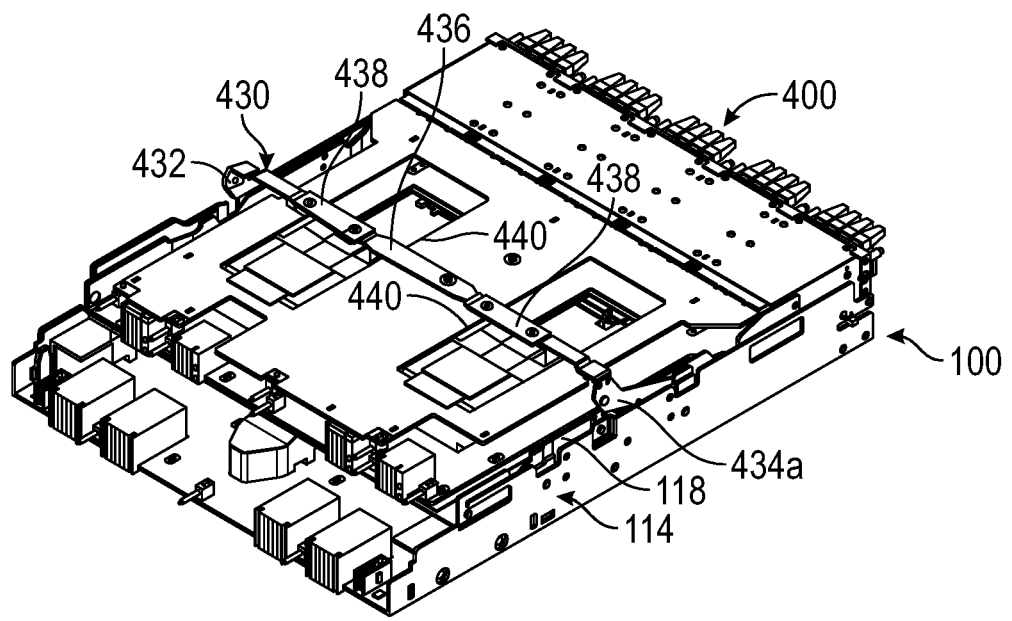
FIG. 6A shows a rear perspective view of the motherboard sled of FIG. 1 while engaging with the input-output sled, according to certain aspects of the present disclosure.
Figure 6B:
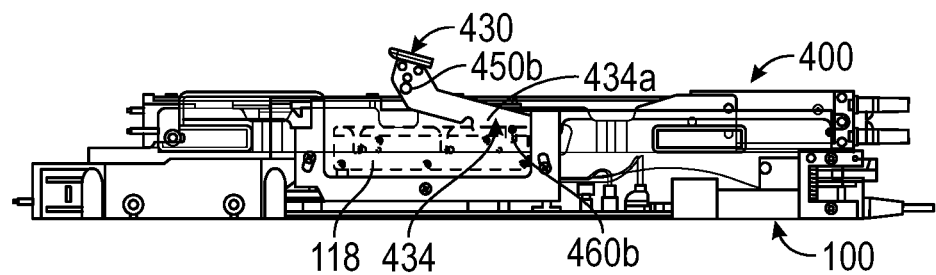
FIG. 6B shows a side view of the motherboard sled of FIG. 1 while engaging with the input-output sled, according to certain aspects of the present disclosure.

FIGS. 6A-6B show a rear perspective view and a side view respectively, of the motherboard sled 100 while engaging with the I/O sled 400. At this position, as the handle 430 is rotated towards the secured position by applying a force (less than one kilogram-force) on the pressing pads 438 (FIG. 4A). FIGS. 6A-6B show a horizontal movement of about 2.5 mm of the guide pins 450a in the second channel 320a (shown in FIG. 4B), and the guide pins 450b in the second channel 320b (shown in FIG. 4C) corresponding to a rotation of the handle 430 of about 60 degrees from the unsecured position.

Figure 7A:
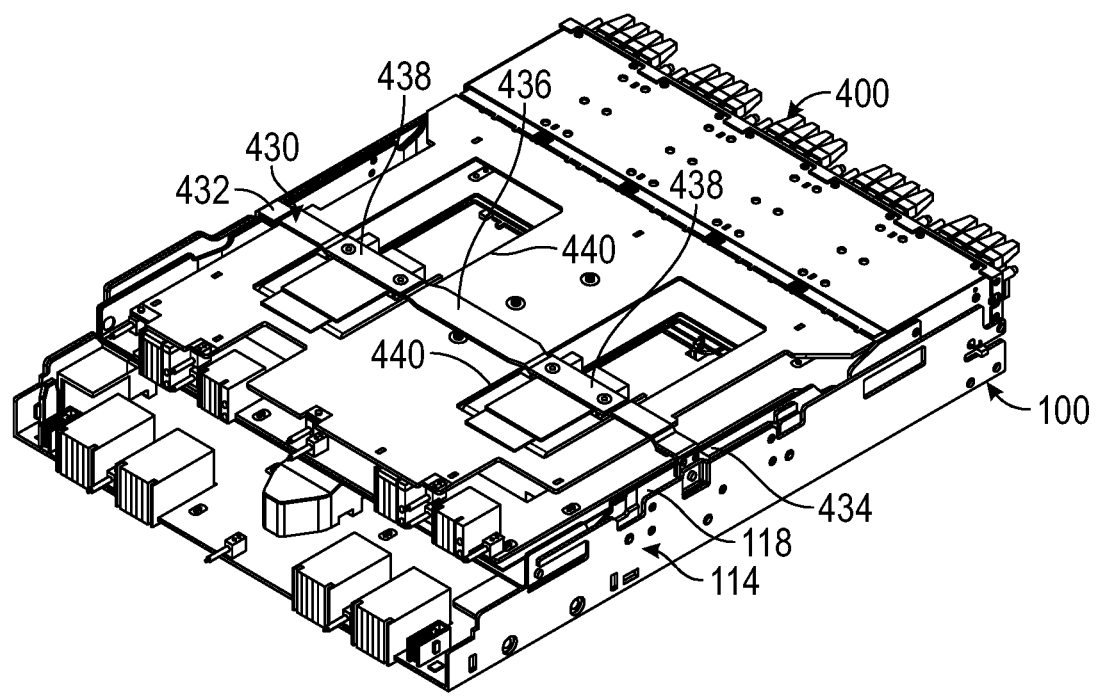
FIG. 7A shows a rear perspective view of the motherboard sled of FIG. 1 after engaging with the input-output sled, according to certain aspects of the present disclosure.
Figure 7B:
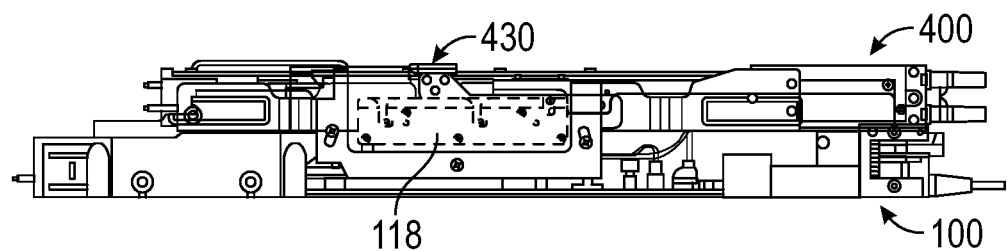
FIG. 7B shows a side view of the motherboard sled of FIG. 1 after engaging with the input-output sled, according to certain aspects of the present disclosure.

FIGS. 7A-7B show a rear perspective view and a side view, respectively, of the motherboard sled 100 after engaging with the I/O sled 400. At this position, the handle 430 has fully rotated into the secured position. FIGS. 7A-7B show a horizontal movement of about 5 mm as the guide pin 450*a* traverses the full length of the second channel 320*a* (shown in FIG. 4B) and the guide pin 450*b* traverses the full length of the second channel 320*b* (shown in FIG. 4C). This aligns, into position, electronic cards (e.g., OCP 3.0 network interface cards) and connectors (e.g., connectors 120*a-d* of the motherboard 130 shown in FIG. 1 and connectors 420*a-d* of the I/O card shown in FIG. 4A) of both the motherboard sled 100 and the I/O sled 400 for operation in the electronic chassis 800.

Disassembly of the I/O sled 400 from the stacked arrangement with the motherboard sled 100 follows a reversal of the steps shown in FIGS. 5A-5B, 6A-6B, and 7A-7B, which disengages the I/O sled 400 with the motherboard sled 100.

FIG. 8 shows a perspective view of an exemplary electronic chassis 800 where the motherboard sled 100 may be used. In the non-limiting embodiment shown in FIG. 8, the electronic chassis 800 belongs to a S7W 6U GPU server having a height 264.4 mm, width 447.8 mm, and a length 885 mm. However, the motherboard sled 100 may be configured for use in any server.

Advantageously, the guide holders can be dimensioned, particularly with regard to the first and second channels therein, to accommodate vertical and horizontal displacements needed by a variety of I/O sled handles and the guide pins positioned thereon. The guide holders can also be dimensioned to fit motherboard sleds that accommodate a variety of motherboards from different manufacturers. Further, the guide holders are designed to occupy optimal space that offers mechanical stability, without blocking airflow into and within the motherboard sled. This means the thermal performance of the motherboard remains unaffected. Overall, the guide holders, as described herein, provide enhanced operational usability that can allow consistent assembly and disassembly of a variety of motherboard sleds with a variety of I/O sleds used in an electronic chassis such as, but not limited to, that used in a computer server.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A motherboard sled configured to be stacked under an input-output sled having a handle rotatable between an unsecured position and a secured position, the motherboard sled comprising:
    a housing having a first sidewall and a second sidewall opposite to the first sidewall;
    a first guide holder coupled to the first sidewall, the first guide holder having a first plurality of slots and a first additional slot, wherein, as the handle is rotated to the secured position, the first plurality of slots are configured to direct motion of a first plurality of guide pins on a first side bar of the handle in a predetermined direction and a first additional slot configured to direct motion of a first additional guide pin on the first side bar of the handle, wherein, when the first plurality of guide pins and the first additional guide pin are engaged with the first plurality of slots and the first additional slot, respectively, the horizontal distance between the first plurality of guide pins and the first additional guide pin decreases as the first plurality of guide pins rotate beyond horizontally parallel relative to the first additional guide pin and toward the secured position; and
    a second guide holder coupled to the second sidewall, the second guide holder having a second plurality of slots and a second additional slot, wherein, as the handle is rotated to the secured position, the second plurality of slots are configured to direct motion of a second plurality of guide pins on a second side bar of the handle in the predetermined direction and a second additional slot configured to direct motion of a second additional guide pin on the second side bar of the handle, wherein, when the second plurality of guide pins and the second additional guide pin are engaged with the second plurality of slots and the second additional slot, respectively, the horizontal distance between the second plurality of guide pins and the second additional guide pin decreases as the second plurality of guide pins rotate beyond horizontally parallel relative to the second additional guide pin and toward the secured position;
    wherein the motion of the first plurality of guide pins and the first additional guide pin, upon completion, lock a first edge of the input-output sled to the first sidewall of the motherboard sled, and wherein the motion of the second plurality of guide pins and the second additional guide pin, upon completion, lock a second edge of the input-output sled to the second sidewall of the motherboard sled.

2. The motherboard sled of claim 1, wherein the first guide holder is coupled to an inner surface of the first sidewall and the second guide holder is coupled to an inner surface of the second sidewall.

3. The motherboard sled of claim 1, wherein:
    the first plurality of guide pins and the first additional guide pin are disposed along an outer surface of the first side bar along a first edge of the handle rotatably coupled to the input-output sled; and
    the second plurality of guide pins and the second additional guide pin are disposed along an outer surface of the second side bar along a second edge of the handle.

4. The motherboard sled of claim 3, wherein at least one of the first plurality of slots and at least one of the second plurality of slots includes (i) a first channel having an exterior end and an interior end, and (ii) a second channel extending contiguously from the interior end of the first channel.

5. The motherboard sled of claim 4, wherein the second channel is generally perpendicular relative to the first channel.

6. The motherboard sled of claim 4, wherein the first channel is generally vertical and the second channel is generally horizontal.

7. The motherboard sled of claim 6, wherein the first channel is configured to direct a vertical displacement of the handle of the input-output sled for locking the input-output sled to the motherboard sled.

8. The motherboard sled of claim 6, wherein the second channel is configured to direct a horizontal displacement of the handle of the input-output sled for locking the input-output sled to the motherboard sled.

9. The motherboard sled of claim 4, wherein:
the exterior end of the first channel of the first plurality of slots is adjacent to a top edge of the first sidewall;
the exterior end of the first channel of the second plurality of slots is adjacent to a top edge of the second sidewall; and
the second channel terminates in a closed end.

10. An electronic chassis comprising: a motherboard sled configured to be stacked under an input-output sled having a handle rotatable between an unsecured position and a secured position, the motherboard sled comprising:
a housing having a first sidewall and a second sidewall opposite to the first sidewall;
a first guide holder coupled to the first sidewall, the first guide holder having a first plurality of slots and a first additional slot, wherein, as the handle is rotated to the secured position, the first plurality of slots are configured to direct motion of a first plurality of guide pins on a first side bar of the handle in a predetermined direction and a first additional slot configured to direct motion of a first additional guide pin on the first side bar of the handle, wherein, when the first plurality of guide pins and the first additional guide pin are engaged with the first plurality of slots and the first additional slot, respectively, the horizontal distance between the first plurality of guide pins and the first additional guide pin decreases as the first plurality of guide pins rotate beyond horizontally parallel relative to the first additional guide pin and toward the secured position; and
a second guide holder coupled to the second sidewall, the second guide holder having a second plurality of slots and a second additional slot, wherein, as the handle is rotated to the secured position, the second plurality of slots are configured to direct motion of a second plurality of guide pins on a second side bar of the handle in the predetermined direction and a second additional slot configured to direct motion of a second additional guide pin on the second side bar of the handle, wherein, when the second plurality of guide pins and the second additional guide pin are engaged with the second plurality of slots and the second additional slot, respectively, the horizontal distance between the second plurality of guide pins and the second additional guide pin decreases as the second plurality of guide pins rotate beyond horizontally parallel relative to the second additional guide pin and toward the secured position;
wherein the motion of the first plurality of guide pins and the first additional guide pin, upon completion, lock a first edge of the input-output sled to the first sidewall of the motherboard sled, and wherein the motion of the second plurality of guide pins and the second additional guide pin, upon completion, lock a second edge of the input-output sled to the second sidewall of the motherboard sled.

11. The electronic chassis of claim 10, wherein the first guide holder is coupled to an inner surface of the first sidewall and the second guide holder is coupled to an inner surface of the second sidewall.

12. The electronic chassis of claim 10, wherein the input-output sled comprises:
the handle rotatably coupled to the input-output sled, the handle comprising:
the first side bar along a first edge of the input-output sled, the first side bar having the first plurality of guide pins and the first additional guide pin disposed along an outer surface thereof; and
the second side bar along a second edge of the input-output sled, the second side bar having the second plurality of guide pins and the second additional guide pin disposed along an outer surface thereof.

13. The electronic chassis of claim 12, wherein at least one of the first plurality of slots and at least one of the second plurality of slots includes (i) a first channel having an exterior end and an interior end, and (ii) a second channel extending contiguously from the interior end of the first channel.

14. The electronic chassis of claim 13, wherein the second channel is generally perpendicular relative to the first channel.

15. The electronic chassis of claim 13, wherein the first channel is generally vertical and the second channel is generally horizontal.

16. The electronic chassis of claim 15, wherein the first channel is configured to direct a vertical displacement of the handle of the input-output sled for locking the input-output sled to the motherboard sled.

17. The electronic chassis of claim 15, wherein the second channel is configured to direct a horizontal displacement of the handle of the input-output sled for locking the input-output sled to the motherboard sled.

18. The electronic chassis of claim 13, wherein:
the exterior end of the first channel of the first plurality of slots is adjacent to a top edge of the first sidewall;
the exterior end of the first channel of the second plurality of slots is adjacent to a top edge of the second sidewall; and
the second channel terminates in a closed end.

* * * * *